(12) United States Patent
Hayakawa et al.

(10) Patent No.: US 11,056,031 B2
(45) Date of Patent: *Jul. 6, 2021

(54) CONTROL DEVICE, OPTICAL SCANNER, DISPLAY DEVICE, AND CONTROL METHOD

(71) Applicant: MITSUMI ELECTRIC CO., LTD., Tokyo (JP)

(72) Inventors: Etsuji Hayakawa, Tokyo (JP); Toyoki Tanaka, Tokyo (JP)

(73) Assignee: MITSUMI ELECTRIC CO., LTD., Tokyo (JP)

( * ) Notice: Subject to any disclaimer, the term of this patent is extended or adjusted under 35 U.S.C. 154(b) by 59 days.

This patent is subject to a terminal disclaimer.

(21) Appl. No.: 16/391,770

(22) Filed: Apr. 23, 2019

(65) Prior Publication Data

US 2019/0355290 A1 Nov. 21, 2019

(30) Foreign Application Priority Data

May 15, 2018 (JP) .............................. JP2018-094040

(51) Int. Cl.
| | |
|---|---|
| *G09G 3/02* | (2006.01) |
| *H01S 5/042* | (2006.01) |
| *G02B 26/10* | (2006.01) |
| *H01S 5/40* | (2006.01) |
| *H01S 5/0683* | (2006.01) |
| *H01S 5/00* | (2006.01) |

(Continued)

(52) U.S. Cl.
CPC ............ *G09G 3/02* (2013.01); *G02B 26/101* (2013.01); *H01S 5/0071* (2013.01); *H01S 5/042* (2013.01); *H01S 5/0683* (2013.01); *H01S 5/06804* (2013.01); *H01S 5/4093* (2013.01); *G02B 26/0858* (2013.01); *G09G 2320/0626* (2013.01)

(58) Field of Classification Search
None
See application file for complete search history.

(56) References Cited

U.S. PATENT DOCUMENTS

2009/0115720 A1* 5/2009 Inada .................. G09G 3/3426
345/102
2009/0262104 A1* 10/2009 Ikegami ............... H04N 9/3155
345/212
(Continued)

FOREIGN PATENT DOCUMENTS

JP 2010-205445 9/2010

*Primary Examiner* — Andre L Matthews
(74) *Attorney, Agent, or Firm* — IPUSA, PLLC (57) ABSTRACT

A control device, which controls a laser scanning display device, includes a laser device, a first current source that generates a first driving current supplied to the laser device, a second current source that generates a second driving current supplied to the laser device, and a controller. The controller controls the first current source to generate the first driving current having a first set current value that is 1/n times a threshold current value at a time when oscillation of the laser device starts, when scanning a non-display area in which no image is displayed, where n is a number greater than 1. The controller controls the second current source to generate the second driving current having a second set current value that is zero or greater and less than 1−1/n times the threshold current value, when scanning the non-display area.

17 Claims, 7 Drawing Sheets

(51) Int. Cl.
    *H01S 5/068*     (2006.01)
    *G02B 26/08*    (2006.01)

(56)  References Cited

U.S. PATENT DOCUMENTS

| | | | | |
|---|---|---|---|---|
| 2014/0253527 A1* | 9/2014 | Ogi | ............................ | G09G 5/02 |
| | | | | 345/207 |
| 2014/0285536 A1* | 9/2014 | Haruna | ................. | H04N 9/3194 |
| | | | | 345/690 |
| 2017/0013239 A1* | 1/2017 | Tabata | ................. | H04N 9/3185 |
| 2017/0332059 A1* | 11/2017 | Tabata | ................. | H04N 9/3164 |
| 2019/0157839 A1* | 5/2019 | Gudaitis | ............... | G02B 27/017 |

* cited by examiner

CONTROL DEVICE, OPTICAL SCANNER, DISPLAY DEVICE, AND CONTROL METHOD

CROSS-REFERENCE TO RELATED APPLICATIONS

This application is based on and claims priority to Japanese Patent Application No. 2018-094040 filed on May 15, 2018, the entire contents of which are incorporated herein by reference.

BACKGROUND OF THE INVENTION

1. Field of the Invention

The present invention relates to a control device, an optical scanner, a display device, and a control method.

2. Description of the Related Art

Figure 1:
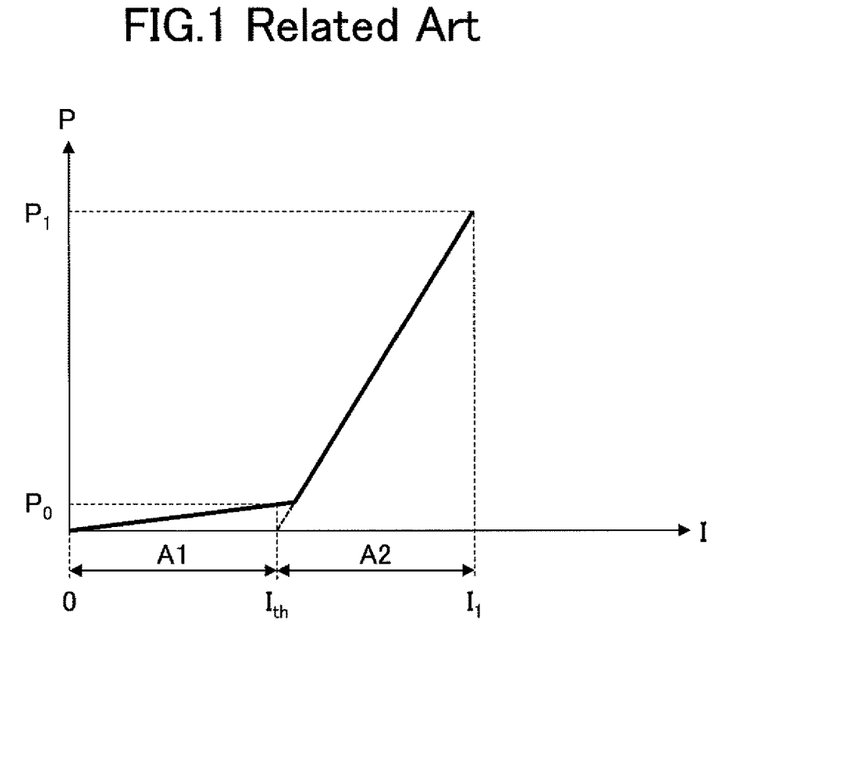
FIG. 1 is a diagram illustrating an example of a relationship (so-called I-L characteristic) between a driving current supplied to a laser device and an optical output of the laser device.

FIG. 1 is a diagram illustrating an example of a relationship between a driving current I supplied to a laser device, such as a Laser Diode (LD) or the like, and an optical output P of the laser device. This relationship corresponds to the so-called driving current versus optical output characteristic (or I-L characteristic). The optical output P in a spontaneous emission region A1 in which the laser device makes the spontaneous emission (for example, Light Emitting Diode (LED) emission), gradually increases with increasing driving current I. Laser oscillation begins when the driving current I reaches a threshold current value $I_{th}$, and the optical output P in an oscillation region A2 in which the laser device makes the laser oscillation, rapidly increases with increasing driving current I, when compared to the spontaneous emission region A1.

An example of a scanning projector proposed in Japanese Laid-Open Patent Publication No. 2010-205445 supplies the threshold current value $I_{th}$ from one current source, and supplies a gradation current value, which is to be added to the threshold current value $I_{th}$, from another current source. The gradation current value corresponds to a difference, current value that is obtained by subtracting the threshold current value $I_{th}$ from a driving current value $I_1$ which causes an optical output value $P_1$ to be output.

Figure 2:
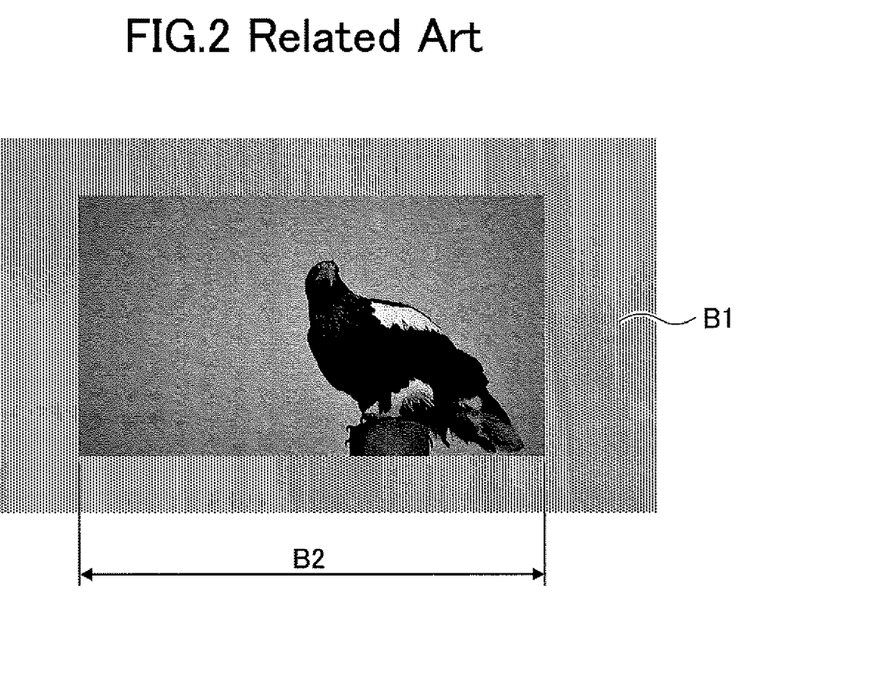
FIG. 2 is a diagram illustrating an example of a non-display area which emits light.

However, as illustrated in FIG. 2, when the driving current having the threshold current value $I_{th}$ generated by one current source is supplied to the laser device during a time in which a non-display area B1, which does not display image, is scanned, the laser device emits light having an optical output value $P_0$. Consequently, the non-display area B1 becomes dimly illuminated. FIG. 2 is a diagram illustrating an example of the non-display area which emits light.

Figure 3:
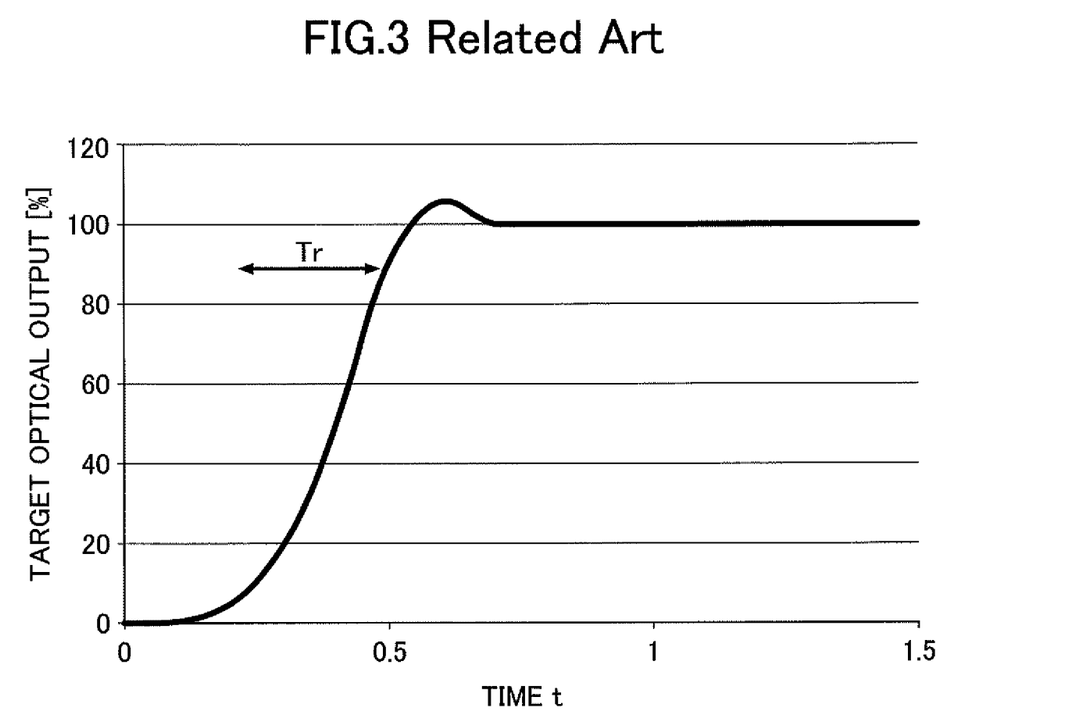
FIG. 3 is a diagram illustrating an example of a transient characteristic of the optical output of the laser device.

In order to prevent the non-display area B1 from becoming dimly illuminated, it is possible not to supply the driving current to the laser device during the time in which the non-display area B1 is scanned. However, because the driving current supplied to the laser device rises from zero, a rise time $T_r$ of the laser device becomes long, as illustrated in FIG. 3. FIG. 3 is a diagram illustrating an example of a transient characteristic of the optical output of the laser device. The rise time $T_r$ corresponds to a rise time response that is required by the laser device to produce an optical output value that rises from 10% to 90% of a target optical output value. As a result, a desired luminance may not be obtained. On the other hand, a resolution may deteriorate.

SUMMARY OF THE INVENTION

Embodiments of the present invention can provide a control device, an optical scanner, a display device, and a control method, which can shorten the rise time of the laser device while reducing the brightness of the non-display area.

According to one aspect of embodiments of the present invention, a control device configured to control a laser scanning display device, includes a laser device; a first current source configured to generate a first driving current supplied to the laser device; a second current source configured to generate a second driving current supplied to the laser device; and a controller configured to control the first current source and the second current source, wherein the controller controls the first current source to generate the first driving current having a first set current value that is 1/n times a threshold current value at a time when oscillation of the laser device starts, when scanning a non-display area in which no image is displayed, where n is a number greater than 1, and wherein the controller controls the second current source to generate the second driving current having a second set current value that is zero or greater and less than 1−1/n times the threshold current value, when scanning the non-display area.

According to another aspect of the embodiments of the present invention, an optical scanner includes the control device described above; and an optical scanning part configured to cause a laser beam emitted from the laser device to perform a scan.

According to still another aspect of the embodiments of the present invention, a display device includes an optical scanner, including the control device described above, and an optical scanning part configured to cause a laser beam emitted from the laser device to perform a scan; and an optical system configured to display an image from the laser beam which is caused to scan by the optical scanning part.

According to a further aspect of the embodiments of the present invention, a control method includes controlling a first current source to generate a first driving current which is supplied to a laser device and has a first set current value that is 1/n times a threshold current value at a time when oscillation of the laser device starts, when scanning a non-display area in which no image is displayed, where n is a number greater than 1; and controlling a second current source to generate a second driving current which is supplied to the laser device and has a second set current value that is zero or greater and less than 1−1/n times the threshold current value, when scanning the non-display area.

Other objects and further features of the present invention will be apparent from the following detailed description when read in conjunction with the accompanying drawings.

DESCRIPTION OF THE PREFERRED EMBODIMENTS

Embodiments of a control device, an optical scanner, a display device, and a control method according to the present invention will be described, by referring to the drawings. In the drawings, those parts that are the same are designated by the same reference numerals, and a repeated description of the same parts may be omitted.

Figure 4:
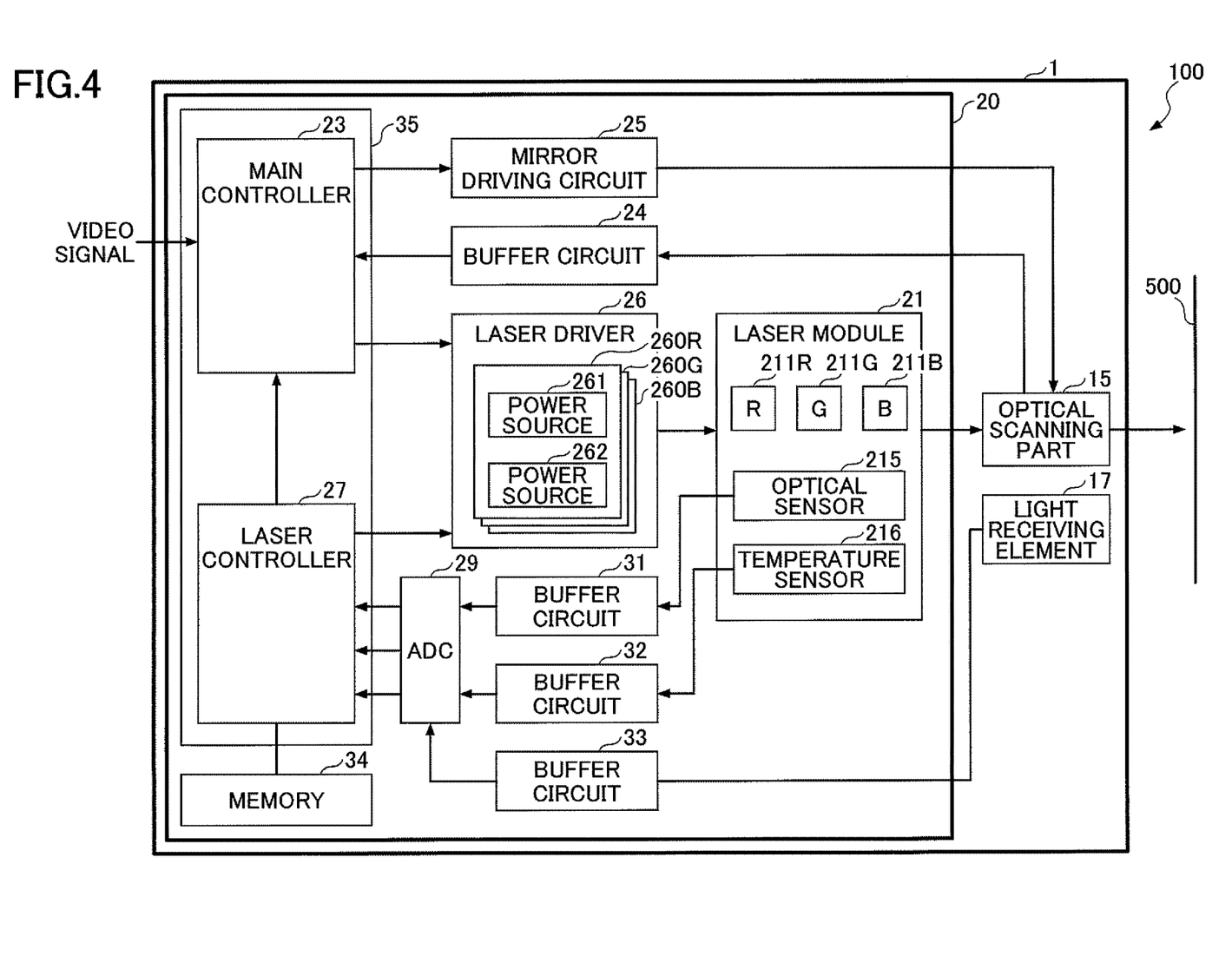
FIG. 4 is a block diagram illustrating an example of a configuration of a display device according to one embodiment.

FIG. 4 is a block diagram illustrating an example of a configuration of a display device according to one embodiment. A laser scanning display device 100 illustrated in FIG. 4 displays image (or picture) according to an external input video signal. Particular examples of the display device 100 may include a head-mount display which projects the image directly on retinae of the user's eyes, a laser projector which displays the image on a display surface such as a screen or the like, a mobile head-up display, or the like.

The display device 100 according to this embodiment may include an optical scanner 1, and an optical system 500, for example. In the optical scanner 1, an optical scanning part 15 causes a laser beam output from a control device 20 to scan, and directs the scanning laser beam toward the optical system 500.

The optical system 500 is an example of a device which displays the image, from the incoming laser beam which is caused to scan by the optical scanning part 15. The optical system 500 may be famed by an optical component which includes a lens, a semi-transparent mirror, or the like, for example. However, the optical component, which forms the optical system 500, may include elements or parts other than the lens and the semi-transparent mirror.

The optical scanner 1 according to this embodiment may include a light receiving element 17, the optical scanning part 15, and the control device 20.

The light receiving element 17 is an example of an optical sensor which detects ambient, external light of the display device 100, and outputs a current according to the brightness of the external light. The light receiving element 17 may be formed by a photodiode or the like, for example.

The optical scanning part 15 causes the incoming laser beam to perform a two-dimensional scan, and the scanning laser beam is directly projected onto a display surface via the optical system 500, to form a two-dimensional image. The optical scanning part 15 oscillates the mirror, to cause the laser beam output from the laser device of the control device 20 to scan.

The optical scanning part 15 may include a single mirror which oscillates with respect to two mutually perpendicular axes, for example. The optical scanning part 15 may be formed by Micro Electro Mechanical Systems (MEMS) manufactured by a semiconductor manufacturing process or the like, for example. The mirror of the optical scanning part 15 may be driven by an actuator which uses a deforming force of a piezoelectric element as the driving force, for example.

The control device 20 according to this embodiment may include a laser module 21, buffer circuits 31 through 33, an Analog-to-Digital Converter (ADC) 29, a controller 35, a buffer circuit 24, a mirror driving circuit 25, a laser driver 26, and a memory 34. The controller 35 may include a main controller 23 and a laser controller 27.

The laser module 21 may include a plurality of laser devices, such as Laser Diodes (LDs) 211R, 211G, and 211B, an optical sensor 215 which monitors the nearest optical output of each of the plurality of laser devices, and a temperature sensor 216 which monitors the temperature (or ambient temperature) of each of the plurality of laser devices.

Each of the LDs 211R, 211G, and 211B emits the laser beam having an optical output according to the current value of the current injected thereto. The LD 211R may emit a red laser beam having a wavelength $\lambda R$ of 640 nm, for example. The LD 211G may emit a green laser beam having a wavelength $\lambda B$ of 530 nm, for example. The LD 211B may emit a blue laser beam having a wavelength $\lambda B$ of 445 nm, for example. The laser beams emitted from the LDs 211R, 211G, and 211B and having these wavelengths are combined by a dichroic mirror or the like, and the combined beam is input to the optical scanning part 15.

The optical sensor 215 may be foisted by a device which monitors the nearest optical output of each of the LDs 211R, 211G, and 211B. The optical sensor 215 monitors the nearest optical output of each of the LDs 211R, 211G, and 211B, and outputs a current according to an amplitude of the detected optical output. The optical sensor 215 may be formed by a light receiving element, such as a photodiode or the like, for example. The optical sensor 215 may be arranged at an arbitrary position capable of detecting the laser beam before the laser beam reaches the optical scanning part 15.

A Neutral-Density (ND) filter may be arranged between the laser module 21 and the optical scanning part 15, as a dimming device or a dimming means. In this case, the laser beams emitted from the LDs 211R, 211G, and 211B and having the wavelengths described above are combined by the dichroic mirror or the like, and input to the ND filter. Further, the optical sensor 215 may be arranged at an arbitrary position capable of detecting the laser beam before the laser beam passes through the ND filter.

The temperature sensor 216 may be formed by a device which monitors the temperature of each of the LDs 211R, 211G, and 211B. The temperature sensor 216 monitors the temperature of each of the LDs 211R, 211G, and 211B, and outputs a current according to a level of the detected temperature. The temperature sensor 216 may be formed by a variable resistive element, such as a thermistor or the like, for example. The temperature sensor 216 may include a plurality of temperature sensing elements provided with respect to the LDs 211R, 211G, and 211B, respectively. Alternatively, the temperature sensor 216 may include a single temperature sensing element that is provided in common with respect to the LDs 211R, 211G, and 211B.

The buffer circuit 31 converts the current output from the optical sensor 215 into a voltage, and outputs the voltage to the ADC 29. The buffer 32 convers the current output from the temperature sensor 216 into a voltage, and outputs the voltage to the ADC 29. The buffer circuit 33 converts the current output from the light receiving element 17 into a voltage, and outputs the voltage to the ADC 29.

The ADC 29 converts the analog voltages output from the buffer circuits 31 through 33 into digital voltages, and outputs the digital voltages to the laser controller 27.

The main controller 23 can control a deflection angle of the mirror (not illustrated) of the optical scanning part 15, for example. The main controller 23 may monitor, through the buffer circuit 24, an inclination angle of the mirror in a horizontal direction obtained by a horizontal displacement sensor (not illustrated) provided in the optical scanning part 15, and an inclination angle of the mirror in a vertical direction obtained by a vertical displacement sensor (not illustrated) provided in the optical scanning part 15, and supply an angle control signal to the mirror driving circuit 25. The mirror driving circuit 25 may control the mirror of the optical scanning part 15 to a predetermined deflection angle, based on the angle control signal from the main controller 23, to drive the optical scanning part to perform the two-dimensional scan by the laser beam.

In addition, the main controller 23 can supply, to the laser driver 26, a driving signal according to an external input digital video signal that is received from outside the control device 20. The main controller 23 may perform a process to separate a synchronizing signal from a luminance signal and a chromaticity signal included within the input digital video signal. The main controller 23 may supply, to the laser driver 26, the driving signal according to the luminance signal, the chromaticity signal, and a correction signal from the laser controller 27. The main controller 23 may use the synchronizing signal to generate the angle control signal which oscillates the mirror of the optical scanning part 15. The outside of the control device 20 may include a Personal Computer (PC), a camera module, or the like provided outside the control device 20 and outputting the input digital video signal or the like, for example.

The laser driver 26 may be formed by a circuit which supplies predetermined currents to the LDs 211R, 211G, and 211B of the laser module 21, based on the driving signal received from the main controller 23. Hence, the LDs 211R, 211G, and 211B respectively emit the red laser beam, the green laser beam, and the blue laser beam modulated according to the video signal. By combining these red, green, and blue laser beams, it is possible to form a color image corresponding to the external input digital video signal that is received from outside the control device 20.

The laser driver 26 may include a number of current source circuits corresponding to the number of laser devices that are provided. According to this embodiment, three current source circuits 260R, 260G, and 260B are provided in correspondence with the three LDs 211R, 211G, and 211B that are provided in the laser module 21. Each of the current source circuits 260R, 260G, and 260B supplies the driving current to the corresponding one of the LDs 211R, 211G, and 211B, to drive each of the LDs 211R, 211G, and 211B. The current source circuit 260R supplies, to the LD 211R, the driving current having a current value that is adjustable. The current source circuit 260G supplies, to the LD 211G, the driving current having a current value that is adjustable. The current source circuit 260B supplies, to the LD 211B, the driving current having a current value that is adjustable.

Each of the current source circuits 260R, 260G, and 260B preferably includes at least two current sources 261 and 262. The first current source 261 may be formed by a circuit, which supplies a first driving current having a current value adjusted based on a current control signal from the laser controller 27, to the corresponding laser device. The second current source 262 may be formed by a circuit, which supplies a second driving current having a current value adjusted based on the driving signal from the main controller 23, to the corresponding laser device. A driving current $I_1$ supplied to the LD 211R is generated from a sum of a first driving current $I_{11}$ generated by the first current source 261 of the current source circuit 260R, and a second driving current $I_{12}$ generated by the second current source 262 of the current source circuit 260R. A driving current $I_2$ supplied to the LD 211G is generated from a sum of a first driving current $I_{21}$ generated by the first current source 261 of the current source circuit 260G, and a second driving current $I_{22}$ generated by the second current source 262 of the current source circuit 260G. A driving current $I_3$ supplied to the LD 211B is generated from a sum of a first driving current $I_{31}$ generated by the first current source 261 of the current source circuit 260G, and a second driving current $I_{32}$ generated by the second current source 262 of the current source circuit 260G.

The output of the light receiving element 17, having a detection value indicating the brightness of the external light, is input to the laser controller 27 via a transmission cable or the like. The laser controller 27 can control the luminance of the image viewed by the user, by controlling (that is, increasing or decreasing) the current values of the driving currents supplied to the LDs 211R, 211G, and 211B, based on the output of the light receiving element 17.

More particularly, the laser controller 27 monitors the brightness of the ambient, external light of the display device 100, from the output of the light receiving element 17, and supplies the current control signal to the laser driver 26 based on the monitored brightness of the external light, to control (that is, increase or decrease) the current values of the driving currents supplied to the LDs 211R, 211G, and 211B.

In addition, the laser controller 27 may monitor the optical outputs at roots of the LDs 211R, 211G, and 211B, for example, from the output of the optical sensor 215, and supply the current control signal to the laser driver 26. The driving currents supplied to the LDs 211R, 211G, and 211B may be controlled based on the current control signal from the laser controller 27, so that the optical outputs of the LDs 211R, 211G, and 211B become predetermined optical output values. For example, the predetermined optical output values are target values that are determined based on the output of the light receiving element 17, and respective errors from the determined target values may be minimized by a feedback control based on the output of the optical sensor 21. The laser controller 27 may generate the correction signal which corrects a gain or the like according to the difference between the optical output value detected by the optical sensor 215 and a predetermined optical output value, with respect to each of the LDs 211R, 211G, and 211B, and supply the correction signal to the main controller 23.

The optical sensor 215 may have a configuration including three sensors which independently detect the optical outputs of the LDs 211R, 211G, and 211B, respectively. Alternatively, the optical sensor 215 may have a configuration including only a single sensor. In this case, the LDs 211R, 211G, and 211B may be controlled to sequentially produce the optical output, so that the single sensor may sequentially detect the optical outputs of the LDs 211R, 211G, and 211B, to enable control of the optical outputs of the LDs 211R, 211G, and 211B using the single sensor.

The laser beam output from the laser module 21 irradiates the mirror of the optical scanning part 15, and is deflected by the mirror to perform the scan. The scanning laser beam from the mirror of the optical scanning part 15 is directly projected onto the display surface via the optical system 500, and forms the two-dimensional image having a predetermined luminance, to be viewed by the user. The laser beam output from the laser module 21 may be irradiated directly on the mirror, or irradiated on the mirror via an optical fiber, or guided to the mirror via an optical component or the like.

The laser controller 27 may also be connected to the main controller 23, the buffer circuit 24, the mirror driving circuit 25, and the laser driver 26. The laser controller 27 may perform initial settings, such as setting a range of the output voltage value of each of the main controller 23, the buffer circuit 24, the mirror driving circuit 25, and the laser driver 26.

Figure 5:
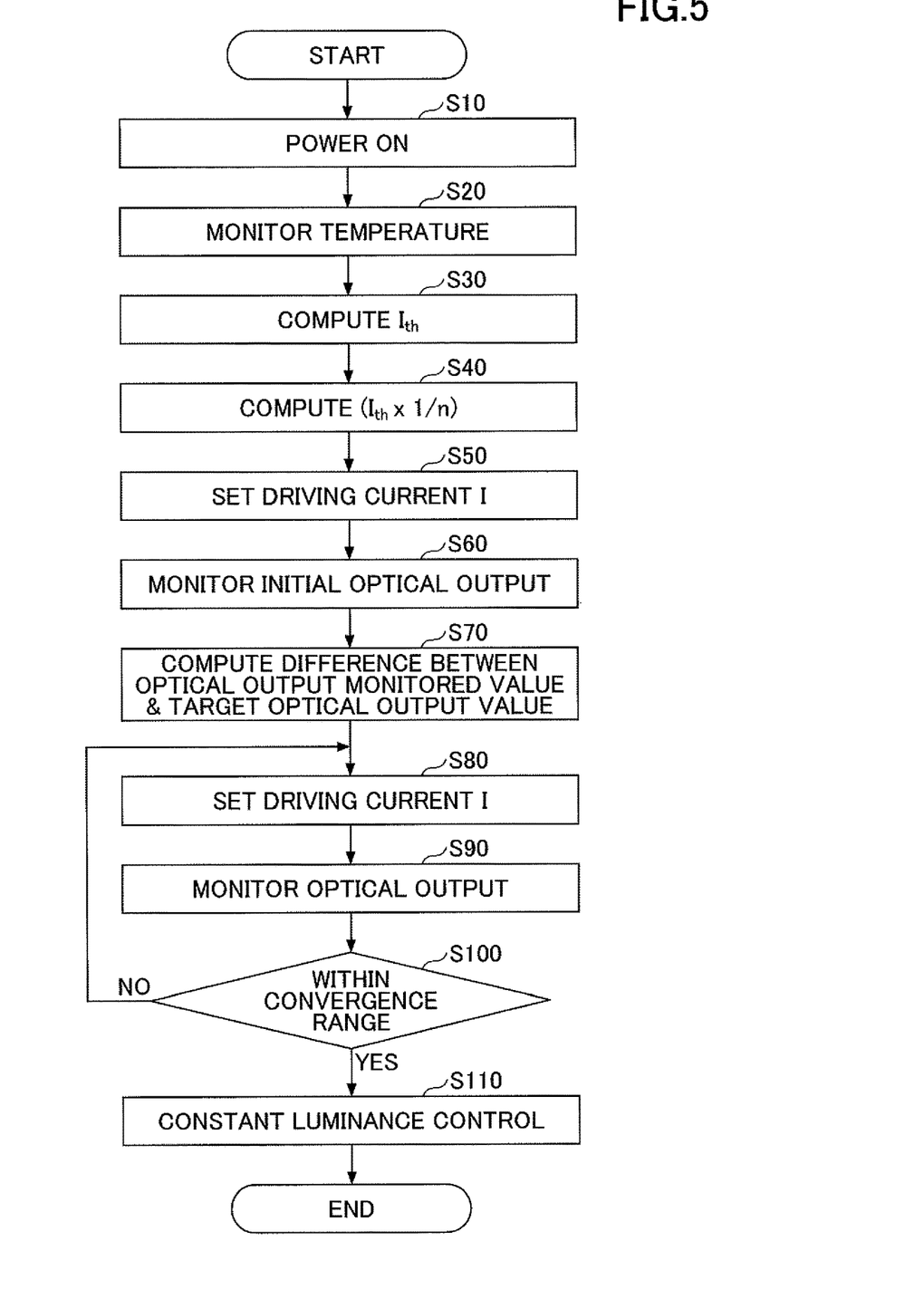
FIG. 5 is a flow chart for explaining an example of a control method according to one embodiment.

FIG. 5 is a flow chart for explaining an example of a control method according to one embodiment. The control method illustrated in FIG. 5 may be performed by the controller 35 (or the laser controller 27 and the main controller 23) of the control device 20 used in the display device 100.

In step S10, the control device 20 is started when the power of the control device 20 turns on.

In step S20, immediately after the control device 20 starts, the laser controller 27 monitors the temperatures of the LDs 211R, 211G, and 211B detected by the temperature sensor 216, and acquires the monitored temperature values. In other words, the laser controller 27 acquires the monitored temperature values of the LDs 211R, 211G, and 211B detected by the temperature sensor 216, before driving of the LDs 211R, 211G, and 211B starts.

In step S30, the laser controller 27 determines an initial value of the threshold current value $I_{th}$ at a time when oscillation of the LD 211R starts, according to the monitored temperature value of the LD 211R detected by the temperature sensor 216 in step S20. Similarly, the laser controller 27 determines an initial value of the threshold current value $I_{th}$ at a time when oscillation of the LD 211G starts, according to the monitored temperature value of the LD 211G detected by the temperature sensor 216 in step S20. Further, the laser controller 27 determines an initial value of the threshold current value $I_{th}$ at a time when oscillation of the LD 211B starts, according to the monitored temperature value of the LD 211B detected by the temperature sensor 216 in step S20.

For example, the laser controller 27 may determine an initial value $I_{th0}$ of the threshold current value $I_{th}$, based on temperature characteristic data $D_c$ of the initial threshold current value $I_{th0}$ at the time when the oscillation of the laser device starts, and the monitored temperature value of this laser device detected by the temperature sensor 216. The laser controller 27 may determine a current corresponding to the monitored temperature value acquired in step S20, based on the temperature characteristic data $D_c$ of the initial threshold current value $I_{th0}$ at the time when the oscillation of the laser device starts, as the initial threshold current value $I_{th0}$.

The temperature characteristic data $D_c$ of the initial threshold current value $I_{th0}$ refers to the data which determines a rule of relationship between a temperature T of the laser device and the initial threshold current value $I_{th0}$. Such temperature characteristic data $D_c$ may be readily prestored in the memory 34.

The memory 34 is preferably a rewritable memory. Even when the optical output characteristic of each laser device changes due to aged deterioration or the like, it is possible to accurately determine the initial threshold current value $I_{th0}$ of each laser device, by updating the temperature characteristic data $D_c$ stored in the memory 34.

The temperature characteristic data $D_c$ prestored in the memory 34 may be map data (or table data) defining the initial threshold current value $I_{th0}$ in correspondence with each temperature of the laser device. Alternatively, the temperature characteristic data $D_c$ prestored in the memory 34 may be coefficient data of an arithmetic expression for computing the initial threshold current value $I_{th0}$ from the temperature T of the laser device.

For example, in a case where the arithmetic expression for computing the initial threshold current value $I_{th0}$ from the temperature T of the laser device is a linear (or first order) function represented by "$I_{th0}=a \times T+b$", where "a" and "b" are temperature correction coefficients, data of the temperature correction coefficients "a" and "b" may be prestored in the memory 34. By substituting the monitored temperature value acquired in step S20 into the temperature T of the linear function described above, it is possible to compute the initial threshold current value $I_{th0}$ corresponding to the monitored temperature value. Of course, the arithmetic expression is not limited to the linear function described above, and may be other functions, such as polynomial functions represented by polynomials in which the degree of the polynomial is two or greater.

In step S40, the laser controller 27 computes a first set current value that is "1/n" times the initial threshold current value $I_{th0}$, where n is a number greater than 1, by reducing the optical output value at the initial threshold current value $I_{th0}$ in order to reduce the brightness in the non-display area B1.

In step S50, the laser controller 27 computes a second set current value that is zero or greater and less than "1−1/n" times the initial threshold current value $I_{th0}$, and computes a sum, current value of the first set current value described above and the second set current value, to determine (or set) the initial threshold current value $I_{th0}$. The laser controller 27 may supply the second set current value to the main controller 23.

In step S50, the laser controller 27 and the main controller 23 cause the driving current, supplied from the laser driver 26 to each laser device, to start and rise from the initial threshold current value $I_{th0}$ determined in step S50. For example, the laser controller 27 and the main controller 23 control the first and second current sources 261 and 262 so that the driving current, supplied from the laser driver 26 to each laser device, starts and rises from the initial threshold current value $I_{th0}$ determined in step S50. Hence, the laser driver 26 controls the first current source 261 so that the first driving current supplied from the first current source 261 to the laser device becomes the first set current value computed in step S40. The main controller 23 controls the second current source 262 so that the second driving current supplied from the second current source 262 to the laser device becomes the second set current value computed in step S50.

The laser controller 27 and the main controller 23 control the laser driver 26 to start driving each laser device from an initial driving current value $I_0$ that is set, to start the oscillation and to start the light emission of each laser device.

This light emission is made in the non-display area B1 which is different from a display area B2 where the display device 100 is to display the image. The laser controller 27 and the main controller 23 causes the driving current value greater than or equal to the initial driving current $I_0$ to be supplied to each laser device, so that the light (or reference light) emitted from each laser device is displayed in the non-display area B1 which is in at least one of upper, lower, right, and left areas located outside a frame of the display area B2, for example.

In step S60, the laser controller 27 monitors the output of the optical sensor which detects the light upon emission of the reference light, to acquire the monitored optical output value of each laser device. In other words, the laser controller 27, after starting the driving current from the initial driving current value $I_0$, acquires the monitored optical output value of each laser device by monitoring the output of the optical sensor 215.

In step S70, the laser controller 27 compares the monitored optical output value acquired in step S50 immediately after driving of each laser device from the initial driving current value $I_0$ starts, and a predetermined target optical output value $P_t$, to compute the difference between the two values. In step S80, the laser controller 27 sets the driving current value (current value of each of the first driving current and the second driving current) supplied from the laser driver 26 to each laser device, so as to minimize the computed difference. For example, the laser controller 27 may vary the set current value of the second driving current, while maintaining the set current value of the first driving current fixed, to supply the varied set current value of the second driving current to the main controller 23. The main controller 23 may control the second current source 262 to supply the varied set current value of the second driving current to the laser device. In step S90, the laser controller 27 monitors the output of the optical sensor 215 when each laser device is driven at the driving current value set in step S80, to acquire the monitored optical output value of each laser device.

In step S90, the laser controller 27 judges whether a difference Δ between the monitored optical output value acquired in step S80 and the prestored target optical output value $P_t$ converges within a predetermined range. When the laser controller 27 judges in step S100 that the difference Δ does not converge within the predetermined range (No in step S100), the laser controller 27 resets the driving current value (current value of each of the first driving current and the second driving current), so as to minimize the difference Δ computed in step S70. For example, the laser controller 27 may vary the set current value of the second driving current, while maintaining the set current value of the first driving current fixed, to supply the varied set current value of the second driving current to the main controller 23. The main controller 23 may control the second current source 262 to supply the varied set current value of the second driving current to the laser, device. In addition, in step S80, the laser controller 27 acquires the monitored optical output value when each laser device is driven at the driving current value set in step S70, to perform the judging process of step S90.

In other words, after starting the driving current of the laser device from the initial driving current value $I_0$, the laser controller 27 controls the driving current of the laser device, so as to minimize the difference Δ between the monitored optical output value acquired by monitoring the output of the optical sensor 215 and the target optical output value $P_t$. In addition, the laser controller 27 repeats the processes of steps S80 through S100, until the difference Δ converges within the predetermined range. The laser controller 27 may perform such a repetition process by a Proportional-Integral (PI) control or a Proportional-Integral-Differential (PID) control.

When the laser controller 27 judges in step S100 that the difference Δ between the monitored optical output value acquired in step S90 and the prestored target optical output value $P_t$ converges within the predetermined range (Yes in step S100), the laser controller 27 performs the process of step S110.

When the difference Δ converges within the predetermined range, the laser controller 27, in step S110, controls the driving current of the laser device, based on the output of the light receiving element 17 which detects the ambient, external light of the display device 100, so that the luminance of the image displayed by the display device 100 becomes constant. As a result, even when the ambient brightness of the display device 100 changes, it is possible to provide the image having the constant luminance to the user. In addition, after the display device 100 is started, the optical output value of each laser device quickly converges to the target optical output value $P_t$, and thus, it is possible to quickly provide the image having the constant luminance to the user.

An upper limit value of the number n (>1) may be determined by a working current ratio between the first driving current and the second driving current. In other words, the number n is required to satisfy the following relationship.

$$\{(\text{First Driving Current}) \times n\} < (\text{Second Driving Current})$$

Figure 6:
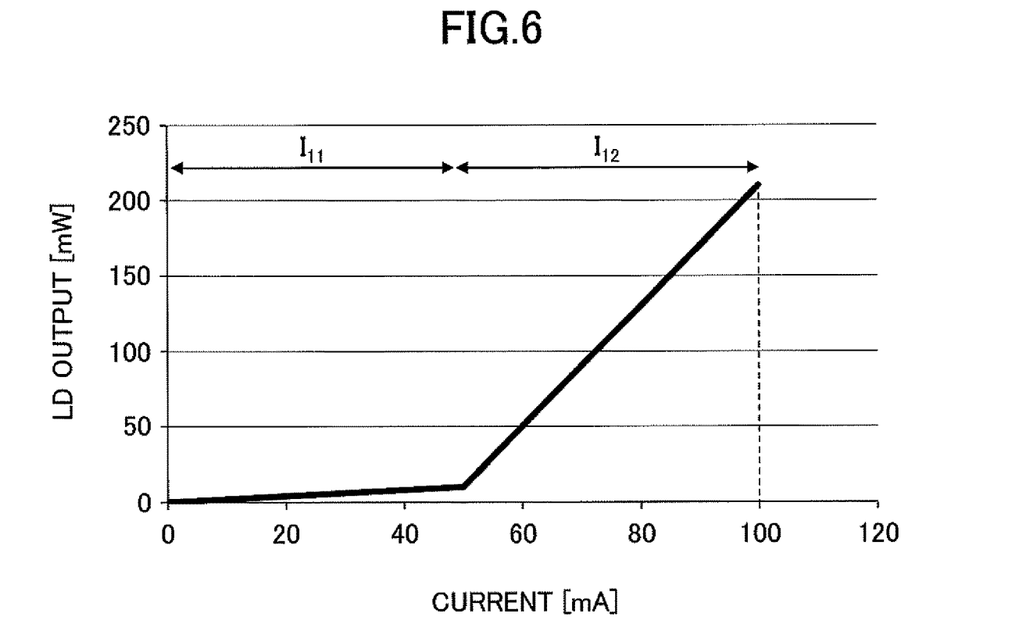
FIG. 6 is a diagram illustrating an example of a relationship between a range in which a current value is adjusted by a first driving current, and a range in which the current value is adjusted by a second driving current.
Figure 7:
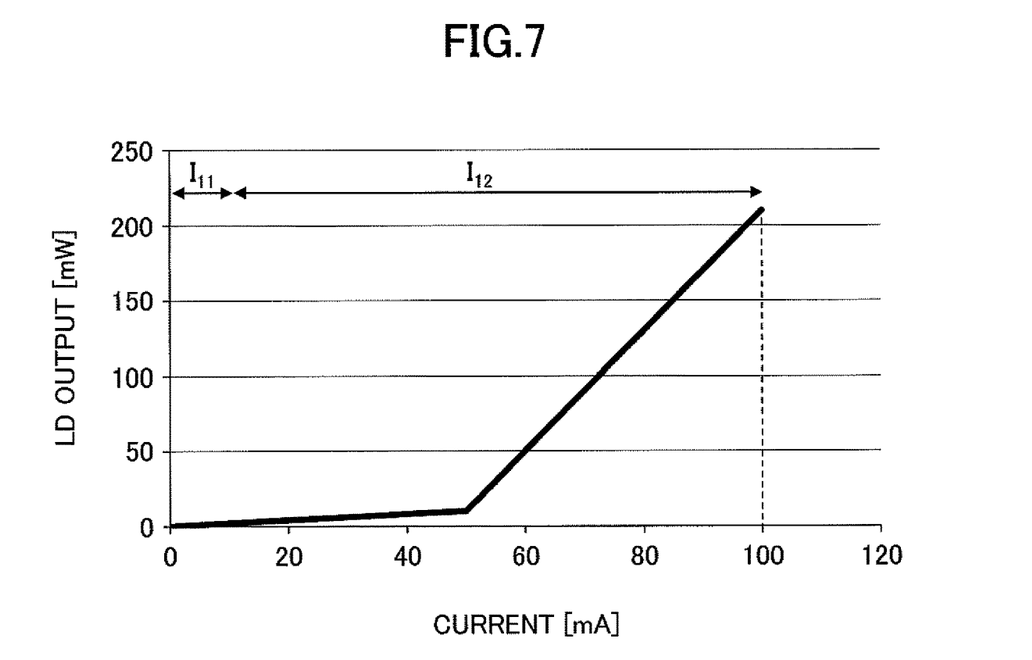
FIG. 7 is a diagram illustrating another example of the relationship between the range in which the current value is adjusted by the first driving current, and the range in which the current value is adjusted by the second driving current.

FIG. 6 is a diagram illustrating an example of a relationship between a range in which the current value is adjusted by the first driving current $I_{11}$ generated from the first current source 261, and a range in which the current value is adjusted by the second driving current $I_{12}$ generated from the second current source 262. FIG. 7 is a diagram illustrating another example of the relationship between the range in which the current value is adjusted by the first driving current $I_{11}$ generated from the first current source 261, and the range in which the current value is adjusted by the second driving current $I_{12}$ generated from the second current source 262. In FIG. 6 and FIG. 7, the ordinate indicates the LD output, that is, the optical output of the laser device. FIG. 6 illustrates a case where n=1, and FIG. 7 illustrates a case where n=5. By varying the value of n, the current value range covered by the first driving current $I_{11}$, and the driving current range covered by the second driving current $I_{12}$, respectively change.

When scanning the non-display area in which no image is displayed, the laser controller 27 controls the first current source 261 so that the first driving current $I_{11}$ becomes the first set current value that is "1/n" times the threshold current value $I_{th}$ at the time when the oscillation of the laser device starts. When scanning the non-display area in which no image is displayed, the main controller 23 controls the second current source 262 so that the second driving current $I_{12}$ becomes the second set current value that is zero or greater and less than "1−1/n" times the threshold current value $I_{th}$ at the time when the oscillation of the laser device starts.

For example, when scanning the non-display area in which no image is displayed, the main controller 23 controls the second current source 262 so that the second driving current $I_{12}$ becomes the second set current value that is zero. In this case, when scanning the non-display area in which no image is displayed, the driving current that is "1/n" times the threshold current value $I_{th}$ is supplied to the laser device, and the rise time of the laser device can be reduced compared to the case where the driving current having the current value that is zero is supplied to the laser device. On the other hand, when scanning the non-display area in which no image is displayed, the driving current that is smaller than the threshold current value $I_{th}$ is supplied to the laser device, and the brightness of the non-display area can be reduced compared to the case where the driving current having the threshold current value $I_{th}$ is supplied to the laser device.

When scanning a portion having a zero luminance level in the display area in which the image is displayed, the laser controller 27 controls the first current source 261 so that the first driving current $I_{11}$ becomes the first set current value that is "1/n" times the threshold current value $I_{th}$ at the time when the oscillation of the laser device starts. When scanning the portion having the zero luminance level in the display area in which the image is displayed, the main controller 23 controls the second current source 262 so that the second driving current $I_{12}$ becomes a third set current value that is greater than or equal to the second set current value. When the third set current value is equal to the second set current value, the brightness of the non-display area in which no image is displayed, and the brightness of the portion having the zero luminance level in the display area in which the image is displayed, can be made the same.

For example, when scanning the portion having the zero luminance level in the display area in which the image is displayed, the laser controller 27 controls the first current source 261 so that the first driving current $I_{11}$ becomes the first set current value that is "1/n" times the threshold current value $I_{th}$ at the time when the oscillation of the laser device starts. On the other hand, when scanning the portion having the zero luminance level in the display area in which the image is displayed, the main controller 23 controls the second current source 262 so that the second driving current $I_{12}$ becomes the third set current value that is zero. In this case, both the non-display area in which no image is displayed, and the portion having the zero luminance level in the display area in which the image is displayed, can be made approximately black. Accordingly, the brightness of the portion having the zero luminance level in the display area in which the image is displayed can be reduced, to improve the contrast of the display area.

When scanning a portion having a non-zero luminance level in the display area in which the image is displayed, the laser controller 27 controls the first current source 261 so that the first driving current $I_{11}$ becomes the first set current value. When scanning the portion having the non-zero luminance level in the display area in which the image is displayed, the main controller 23 controls the second current source 262 so that the second driving current $I_{12}$ becomes a fourth set current value that is greater than the third set current value.

The fourth set current value is preferably greater than or equal to a difference, current value that is obtained by subtracting the first set current value from the threshold current value $I_{th}$. In this case, when scanning the portion having the non-zero luminance level in the display area in which the image is displayed, the driving current supplied to one laser device can be set to the current value that is greater than or equal to the threshold current value $I_{th}$.

When scanning the portion having the non-zero luminance level in the display area in which the image is displayed in a case where the second set current value and the third set current value are zero, the laser controller 27 controls the first current source 261 so that the first driving current $I_{11}$ becomes the first set current value. On the other hand, when scanning the portion having the non-zero luminance level in the display area in which the image is displayed in the case where the second set current value and the third set current value are zero, the main controller 23 controls the second current source 262 so that the second driving current $I_{12}$ becomes greater than or equal to "1−1/n" times the threshold current value $I_{th}$. In this case, when scanning the portion having the non-zero luminance level in the display area in which the image is displayed, the driving current supplied to one laser device can be set to the current value that is greater than or equal to the threshold current value $I_{th}$.

In addition, when scanning the portion having the non-zero luminance level in the display area in which the image is displayed in the case where the second set current value and the third set current value are zero, the main controller 23 preferably controls the second current source 262 so that the second driving current $I_{12}$ becomes a sum, current value of the current value which is "1−1/n" times the threshold current value $I_{th}$ and a current value according to the luminance level of the input video signal. In this case, the portion having the non-zero luminance level in the display area in which the image is displayed, can be adjusted to a brightness according to the luminance level of the input video signal.

Figure 8:
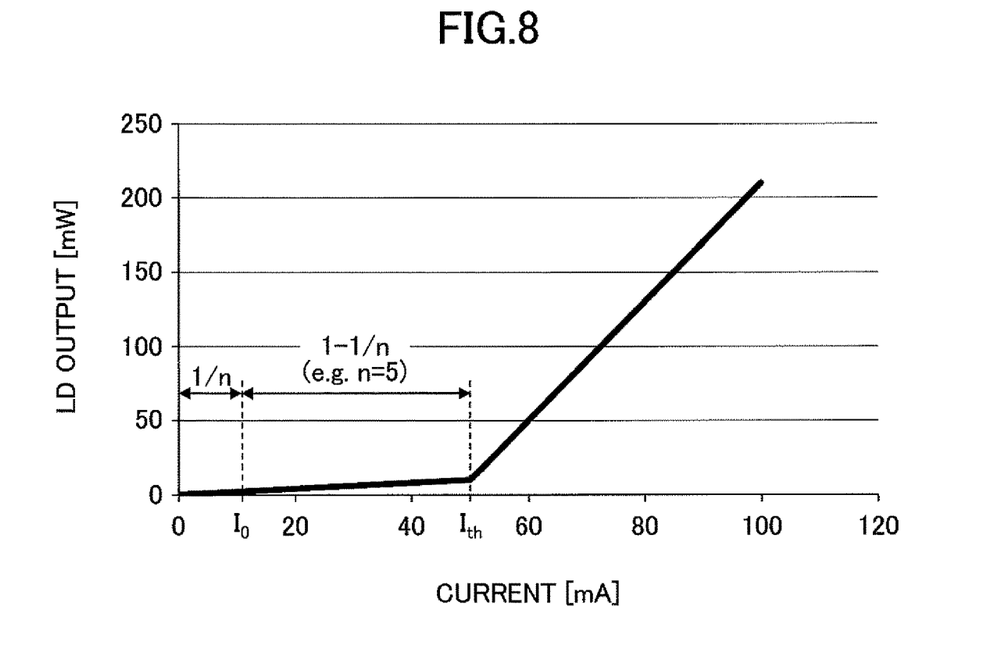
FIG. 8 is a diagram illustrating an example of an I-L characteristic when n=5.
Figure 9:
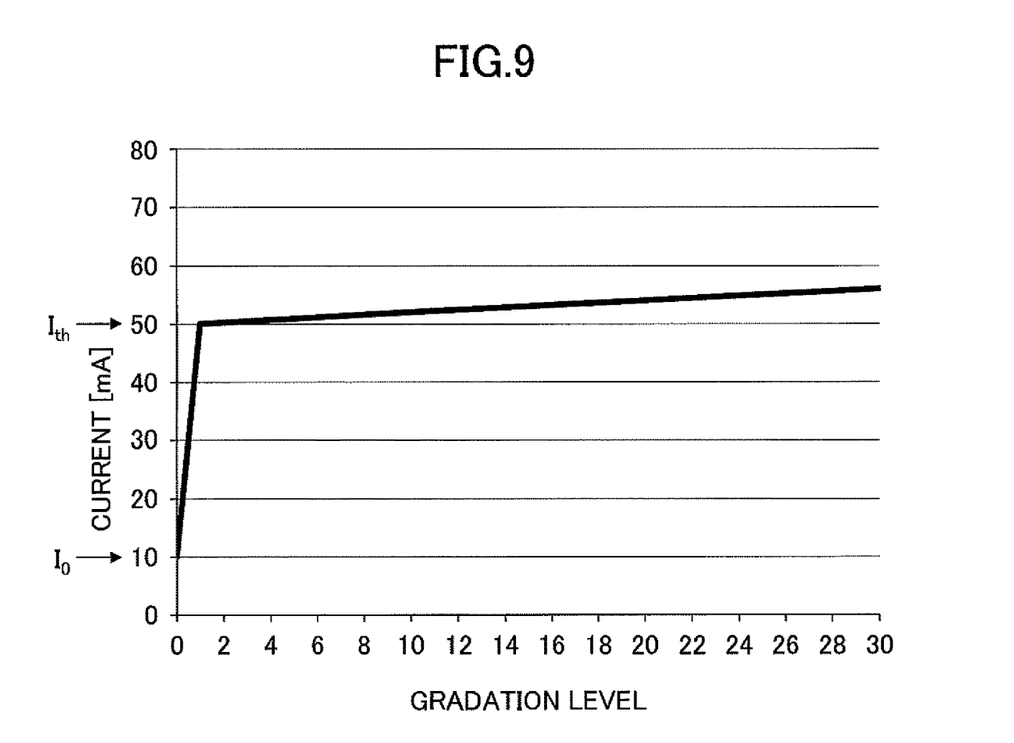
FIG. 9 is a diagram illustrating a relationship between a gradation level and the driving current for the example illustrated in FIG. 8.

FIG. 8 is a diagram illustrating an example of an I-L characteristic when n=5. FIG. 9 is a diagram illustrating a relationship between a gradation level and the driving current for the example illustrated in FIG. 8.

Even when the luminance level of the input video signal is "0", the first current having the current value $I_0$ which is "1/n" times the threshold current value is supplied to the laser device. When the luminance level of the input video signal becomes "1" and the second set current value and the third set current value are zero, the driving current having the current value exceeding the threshold current value $I_{th}$ is supplied to the laser device, to output a color having the luminance level "1".

Figure 10:
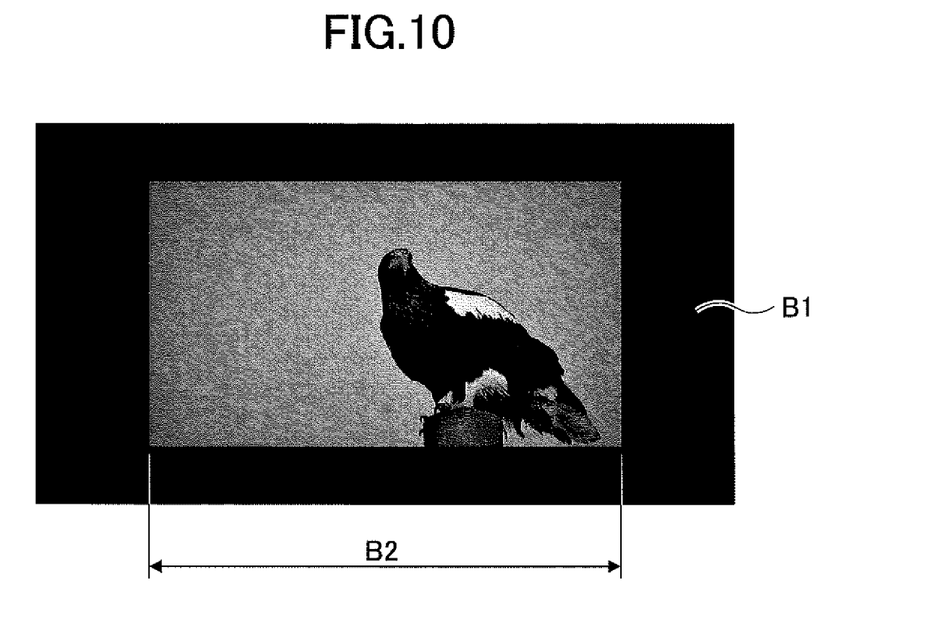
FIG. 10 is a diagram illustrating an example in which the light emission of the non-display area is reduced.

Accordingly, the disclosed technique can reduce the light emission in the non-display area B1 as illustrated in FIG. 10, even for each of each of the Red (R), Green (G), and Blue (B) colors, and enable the effect of reducing the misadjusted black level to be obtained. FIG. 10 is a diagram illustrating an example in which the light emission of the non-display area is reduced. The effect of reducing the misadjusted black level will be described below.

The laser device is driven by the first current source 261 and faintly emits light, in the non-display area B1, and also the portion (black portion) having the zero luminance level in the display area B2. However, by reducing the current value supplied to the laser device in the non-display area B1 to "1/n" times the threshold current value $I_{th}$, it is possible to reduce the brightness of the non-display area B1. In addition, the black portion of the display area B2 can be displayed in a state where the spontaneous emission is reduced.

In addition, by reducing the rise time of the laser device compared to the case where the driving current value is raised from zero, it is possible to display the image using projection times (or display times) that are short to a certain extent. Consequently, the resolution of the display device is improved, and it is possible to display clear and sharp images.

Functions of the main controller 23 and the laser controller 27 may be performed by a processor which executes a program stored in a non-transitory computer-readable storage medium, such as the memory 34, for example. The processor may be formed by a Central Processing Unit (CPU), for example.

According to each of the embodiments described above, when scanning the non-display area in which no image is displayed, the current having the current value that is greater than or equal to "1/n" times the threshold current value is supplied to the laser device. Hence, compared to the case where the current having the zero current value is supplied to the laser device, it is possible to reduce the rise time of the laser device. On the other hand, according to each of the embodiments described above, when scanning the non-display area in which no image is displayed, the current having the current value smaller than the threshold current value is supplied to the laser device. Hence, compared to the case where the current having the threshold current value is supplied to the laser device, it is possible to reduce the brightness of the non-display area.

Hence, the embodiments described above can shorten the rise time of the laser device while reducing the brightness of the non-display area.

The description above use terms such as "determine", or the like to describe the embodiments, however, such terms are abstractions of the actual operations that are performed. Hence, the actual operations that correspond to such terms may vary depending on the implementation, as is obvious to those skilled in the art.

Further, the present invention is not limited to these embodiments, but various variations, modifications, and substitutions of a part or all of the embodiments may be made without departing from the scope of the present invention.

What is claimed is:

1. A control device configured to control a laser scanning display device, comprising:
    a laser device:
    a first current source configured to generate a first driving current supplied to the laser device;
    a second current source configured to generate a second driving current supplied to the laser device; and
    a controller configured to control the first current source and the second current source,
    wherein the controller controls the first current source to generate the first driving current having a first set current value that is 1/n times a threshold current value at a time when oscillation of the laser device starts, when scanning a non-display area in which no image is displayed, where n is a number greater than 1, and when scanning a portion having a zero luminance level in a display area in which an image is displayed, and
    wherein the controller controls the second current source to generate the second driving current having a second set current value within a range that is zero or greater but less than 1−1/n times the threshold current value, when scanning the non-display area, and having a third set current value greater than or equal to the second set current value, when scanning the portion having the zero luminance level in the display area.

2. The control device as claimed in claim 1, wherein the controller controls the first current source to generate the first driving current having the first set current value, when scanning a portion having a non-zero luminance level in the display area, and
    the controller controls the second current source to generate the second driving current having a fourth set current value greater than or equal to the third set current value, when scanning the portion having the non-zero luminance level in the display area.

3. The control device as claimed in claim 2, wherein the fourth set current value has a difference, current value that is obtained by subtracting the first set current value from the threshold current value.

4. The control device as claimed in claim 1, wherein the third set current value is equal to the second set current value.

5. The control device as claimed in claim 2, wherein the second set current value is zero.

6. The control device as claimed in claim 3, wherein the second set current value and the third set current value are zero, and
    the fourth set current value is a sum current value of a current value that is 1-1/n times
    the threshold current value, and a current value according to a luminance level of an input video signal.

7. A control device configured to control a laser scanning display device, comprising:
    a laser device:
    a first current source configured to generate a first driving current supplied to the laser device:
    a second current source configured to generate a second driving current supplied to the laser device; and
    a controller configured to control the first current source and the second current source,
    wherein the controller controls the first current source to generate the first driving current having a first set current value that is 1/n times a threshold current value at a time when oscillation of the laser device starts, when scanning a non-display area in which no image is displayed, and when scanning a portion having a zero luminance level in a display area in which an image is displayed, where n is a number greater than 1,
    wherein the controller controls the second current source to generate the second driving current having a second set current value within a range that is zero or greater but less than 1−1/n times the threshold current value, when scanning the non-display area, and having the second set current value that is zero, when scanning the non-display area, and
    when scanning the portion having the zero luminance level in the display area.

8. The control device as claimed in claim 7, wherein the controller controls the first current source to generate the first driving current having the first set current value, when scanning a portion having a non-zero luminance level in the display area, and
    the controller controls the second current source to generate the second driving current having a third set current value greater than or equal to 1−1/n times the threshold current value, when scanning the portion having the non-zero luminance level in the display area.

9. The control device as claimed in claim 8, wherein the controller controls the second current source to generate the second driving current having a fourth set current value, when scanning the portion having the non-zero luminance level in the display area,
    wherein the fourth set current value is a sum current value of a current value that is 1−1/n times the threshold current value, and a current value according to a luminance level of an input video signal.

10. An optical scanner comprising:
    the control device according to claim 1; and
    an optical scanning part configured to cause a laser beam emitted from the laser device to perform a scan.

11. A display device comprising:
    an optical scanner, including the control device according to claim 1, and an optical scanning part configured to cause a laser beam emitted from the laser device to perform a scan; and an optical system configured to display an image from the laser beam which is caused to scan by the optical scanning part.

12. A control method comprising:

controlling a first current source to generate a first driving current which is supplied to a laser device and has a first set current value that is 1/n times a threshold current value at a time when oscillation of the laser device starts, when scanning a non-display area in which no image is displayed, where n is a number greater than 1;

controlling a second current source to generate a second driving current which is supplied to the laser device and has a second set current value within a range that is zero or greater but less than 1−1/n times the threshold current value, when scanning the non-display area;

controlling the first current source to generate the first driving current having the first set current value, when scanning a portion having a zero luminance level in a display area in which an image is displayed; and controlling the second current source to generate the second driving current having a third set current value greater than or equal to the second set current value, when scanning the portion having the zero luminance level in the display area.

13. The control method as claimed in claim 12, further comprising:

controlling the first current source to generate the first driving current having the first set current value, when scanning a portion having a non-zero luminance level in the display area; and controlling the second current source to generate the second driving current having a fourth set current value greater than or equal to the third set current value, when scanning the portion having the non-zero luminance level in the display area.

14. The control method as claimed in claim 13, wherein the fourth set current value has a difference, current value that is obtained by subtracting the first set current value from the threshold current value.

15. The control method as claimed in claim 12, wherein the third set current value is equal to the second set current value.

16. The control method as claimed in claim 12, wherein the second set current value is zero.

17. The control method as claimed in claim 16, wherein the second set current value and the third set current value are zero, and the fourth set current value is a sum current value of a current value that is 1−1/n times the threshold current value, and a current value according to a luminance level of an input video signal.

* * * * *